United States Patent
Wang

(10) Patent No.: US 9,673,278 B2
(45) Date of Patent: Jun. 6, 2017

(54) METHOD OF PREVENTING DRAIN AND READ DISTURBANCES IN NON-VOLATILE MEMORY DEVICE

(71) Applicant: SEMICONDUCTOR MANUFACTURING INTERNATIONAL (SHANGHAI) CORPORATION, Shanghai (CN)

(72) Inventor: Chengcheng Wang, Shanghai (CN)

(73) Assignee: Semiconductor Manufacturing International (Shanghai) Corporation, Shanghai (CN)

(*) Notice: Subject to any disclaimer, the term of this patent is extended or adjusted under 35 U.S.C. 154(b) by 0 days.

(21) Appl. No.: 14/820,547

(22) Filed: Aug. 6, 2015

(65) Prior Publication Data
US 2016/0043176 A1 Feb. 11, 2016

(30) Foreign Application Priority Data
Aug. 7, 2014 (CN) .......................... 2014 1 0387740

(51) Int. Cl.
| | |
|---|---|
| H01L 29/08 | (2006.01) |
| H01L 29/78 | (2006.01) |
| H01L 29/66 | (2006.01) |
| H01L 21/265 | (2006.01) |
| H01L 27/11521 | (2017.01) |
| H01L 21/266 | (2006.01) |
| H01L 21/8234 | (2006.01) |

(52) U.S. Cl.
CPC ...... *H01L 29/0847* (2013.01); *H01L 29/6656* (2013.01); *H01L 29/6659* (2013.01); *H01L 29/66492* (2013.01); *H01L 29/66659* (2013.01); *H01L 29/7835* (2013.01); *H01L 21/266* (2013.01); *H01L 21/26513* (2013.01); *H01L 21/26586* (2013.01); *H01L 21/823425* (2013.01); *H01L 27/11521* (2013.01)

(58) Field of Classification Search
None
See application file for complete search history.

(56) References Cited

U.S. PATENT DOCUMENTS

| | | | |
|---|---|---|---|
| 5,672,530 A * | 9/1997 | Hsu | ............... H01L 29/66575 257/E21.151 |
| 2003/0222319 A1* | 12/2003 | Azuma | ............ H01L 29/41775 257/408 |

* cited by examiner

*Primary Examiner* — Hrayr A Sayadian
(74) *Attorney, Agent, or Firm* — Kilpatrick Townsend & Stockton LLP

(57) ABSTRACT

A source-drain structure and method of manufacturing the same are disclosed. The source-drain structure includes a substrate containing a drain region and a source region. The drain region includes a lightly-doped ultra-shallow junction and a heavily-doped region, and a drain-substrate junction disposed in the vicinity of a junction between a side portion and a bottom portion of the lightly-doped ultra-shallow junction and the substrate, a plurality of impurity ions in the drain-substrate junction and a plurality of impurity ions in the lightly-doped ultra-shallow junction are opposite-conductivity type ions. The drain-substrate junction can smooth out the steep surface of the lightly-doped ultra-shallow junction to minimize the maximum electric field and reduce the ion flow close to the channel, and effectively reduce the inter-band tunneling hot electron effect.

9 Claims, 7 Drawing Sheets

METHOD OF PREVENTING DRAIN AND READ DISTURBANCES IN NON-VOLATILE MEMORY DEVICE

CROSS-REFERENCES TO RELATED APPLICATIONS

This application claims priority to Chinese patent application No. 201410387740.5, filed Aug. 7, 2014, the content of which is incorporated herein by reference in its entirety.

BACKGROUND OF THE INVENTION

The present invention relates to semiconductor manufacturing technology, and more particularly to a source-drain structure and method of manufacturing the same.

It is generally known in the art, when programming an individual memory cell within a bit line, all of the memory cells sharing the same bit line are subject to a high drain bias, which is referred to as drain disturb or program disturb. Meanwhile, continuing drain bias leading to a long pulse time of a read operation will cause a soft-write operation of the memory cells sharing the same bit line. As the size of flash memory devices continues to shrink, the drain bias leading to drain disturbance in the bit lines of a flash memory array limits the reliability of a flash memory device.

Referring to FIG. 1, during the programming operation, although a memory cell A does not detect a gate voltage, the memory cell A can detect the programming drain voltage (about 4 V). This stress voltage is present when any of the memory cells of a bit line (there may be thousands of memory cells) is being programmed. The high floating gate potential on the erased cell facilitates electron injection into the floating gate, if the tunnel oxide quality is poor, a programmed cell can lose charge due to the high electric field between the drain and the floating gate. Thus, it is important to ensure a good quality of tunnel oxide even after several programming and erase cycles.

Particularly, for a typical memory device unit, a certain drain voltage is required by a channel hot electron (CHE) program mechanism, the channel doping level must be very high to prevent cell punch-through from occurring under the high programming voltage. The high channel doping level results in a relatively steep doping distribution at the drain junction, that generates a tunneling effect, to thereby stimulate hot electron effect, so that a high electric field is generated in the traverse direction of the drain-substrate junction, which increases the drain disturbance and reduces the device reliability. Therefore, reducing the maximal electric field in the drain-substrate junction of flash memory cells, and hence reducing the generation of hot carriers is a key approach to suppress drain and read disturbs.

FIGS. 2A through 2C are cross-sectional views of intermediate stages of a conventional method of manufacturing a source-drain structure. FIG. 2A is a cross-sectional view of a semiconductor structure after the formation of a first gate electrode, a second gate electrode, and a third electrode. Referring to FIG. 2A, a source region 10' is formed in a portion located between a first gate electrode a1' and a second gate electrode a2', a drain region 20' is formed in a portion located between the second gate electrode a2' and a third gate electrode a3'. Thereafter, an opposite-conductivity type ion implantation (i.e., an ion implantation with the opposite conductivity type) is performed into a self-aligned source region 102' by controlling the implantation angle, dose and energy to form a source-substrate junction 103' in the side surface and bottom side of the self-aligned source region 102'.

FIG. 2B is a cross-sectional view of an intermediate stage after the formation of a lightly doped drain region by performing a lightly doped drain implant. The lightly doped drain junction 104' has an edge curvature that is relatively small with respect to the edge curvature of the source-substrate junction 103', so that the edge of the lightly doped drain junction 104' is relatively steep with respect to the source-substrate junction 103'.

FIG. 2C is a cross-sectional view illustrating the stage after spacers have been formed on sidewalls of the first, second, and third gate electrodes. The spacers between the first and second gate electrodes a1', a2' are in physical contact. Then, an ion implantation is performed into the exposed portion of the substrate 101' located between the second and third gate electrodes a2' and a3' to form a heavily doped drain region 107'.

The prior art approach typically utilizes a low operating voltage to suppress the drain disturb, so that the device performance is improved at the expense of reduced programming speed. Therefore, a novel method is needed to solve the problems of drain disturb present in the source-drain structure.

BRIEF SUMMARY OF THE INVENTION

Embodiments of the present invention provide a source-drain structure and method of manufacturing the same to solve the drain disturb problems in the source-drain structure.

According to an embodiment of the present invention, a source-drain structure includes a substrate comprising a drain region and a source region. The drain region includes a lightly-doped ultra-shallow junction and a heavily-doped region, and a drain-substrate junction disposed in the vicinity of a junction between a side portion and a bottom portion of the lightly-doped ultra-shallow junction and the substrate, a plurality of impurity ions in the drain-substrate junction and a plurality of impurity ions in the lightly-doped ultra-shallow junction are opposite-conductivity type ions.

In one embodiment, the drain-substrate junction comprises an edge curvature that is smaller than an edge curvature of the lightly-doped ultra-shallow junction.

In one embodiment, the drain-substrate junction comprises an impurity ion concentration smaller than an impurity ion concentration of the heavily-doped region.

In one embodiment, the source region includes a source-substrate disposed in the vicinity of a junction between a side portion and a bottom portion of the source region and the substrate.

In one embodiment, the source-drain structure further includes a gate electrode disposed on a surface of the substrate between the source region and the drain region, and spacers disposed on opposite sidewalls of the gate electrode and extending along the gate electrode to an edge of the heavily-doped drain region.

In one embodiment, the source-drain structure may further include an n-type channel, wherein the impurity ions in the drain-substrate junction are p-type ions.

Embodiments of the present invention also provide a method of manufacturing a source-drain structure. The method may include forming a plurality of gate electrodes on a substrate, forming a drain region and a source region, forming a lightly-doped ultra-shallow junction in the drain region, forming spacers on opposite sides of the gate electrodes, performing an opposite-conductivity type deep ion implantation onto the lightly-doped ultra-shallow junction to form a drain-substrate junction in the vicinity of a junction between a side portion and a bottom portion of the lightly-doped ultra-shallow junction and the substrate. The opposite-conductivity type deep ion implantation comprises a plurality of first impurity ions and the drain-substrate junction comprising a plurality of second impurity ions, the first and second impurities ions are opposite-conductivity type ions. The method also includes performing a heavily-doped ion implantation onto the lightly-doped ultra-shallow junction to form a heavily-doped drain region.

In one embodiment, spacers facing each other on adjacent gate electrodes in the source region are in contact with each other.

In one embodiment, the anti-type deep ion implantation is performed at an angle of an ion beam in relation to a surface of the substrate in a range between 45 degrees and 85 degrees, and an energy in a range between 10 keV and 50 keV.

In one embodiment, the anti-type deep ion implantation is performed with a doe smaller than a dose of the heavily-doped ion implantation.

In one embodiment, the heavily-doped ion implantation is performed with a dose in a range between $2E11$ cm$^{-2}$ and $2E13$ cm$^{-2}$.

In one embodiment, the method further includes, prior to forming the lightly-doped ultra-shallow junction in the drain region, performing a self-aligned ion implantation onto a portion of the substrate to form a self-aligned source region, and performing a deep anti-type ion implantation onto the formed self-aligned source region to form a source-substrate junction in close proximity to a junction portion between a side surface and bottom surface of the self-aligned source region and the substrate.

The following detailed description together with the accompanying drawings will provide a better understanding of the nature and advantages of the present invention.

BRIEF DESCRIPTION OF THE DRAWINGS

FIG. 5 is a cross-sectional view illustrating a structure after the formation of multiple gate electrodes according to an embodiment of the present invention;

FIG. 6 is a cross-sectional view illustrating a structure after the formation of a self-aligned source region of FIG. 5 according to an embodiment of the present invention;

FIG. 7 is a cross-sectional view illustrating a structure after the formation a source-substrate junction by performing an opposite-conductivity type ion implantation to the self-aligned source region of FIG. 6;

FIG. 8 is a cross-sectional view illustrating a structure after the formation of a lightly-doped ultra-shallow junction of FIG. 7;

FIG. 9 is a cross-sectional view illustrating a structure after forming spacers of FIG. 8;

FIG. 10 is a cross-sectional view illustrating a structure after forming a drain-substrate junction of FIG. 9; and FIG. 11 is a cross-sectional view illustrating a structure after forming a heavily-doped drain region of FIG. 10 according to an embodiment of the present invention.

DETAILED DESCRIPTION OF THE INVENTION

Figure 1:
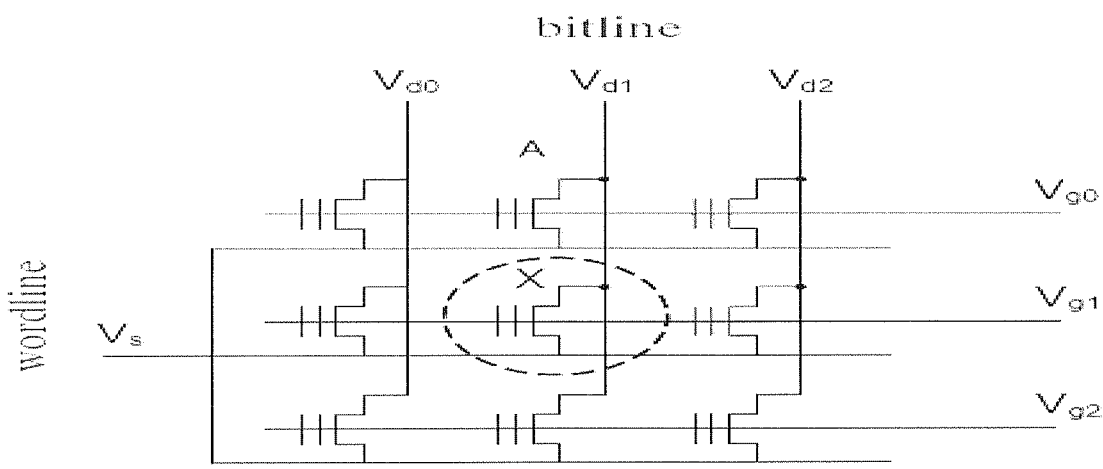
FIG. 1 is a simplified circuit diagram illustrating a drain disturb of an amorphous flash memory array circuit, as known in the prior art.
Figure 2A:
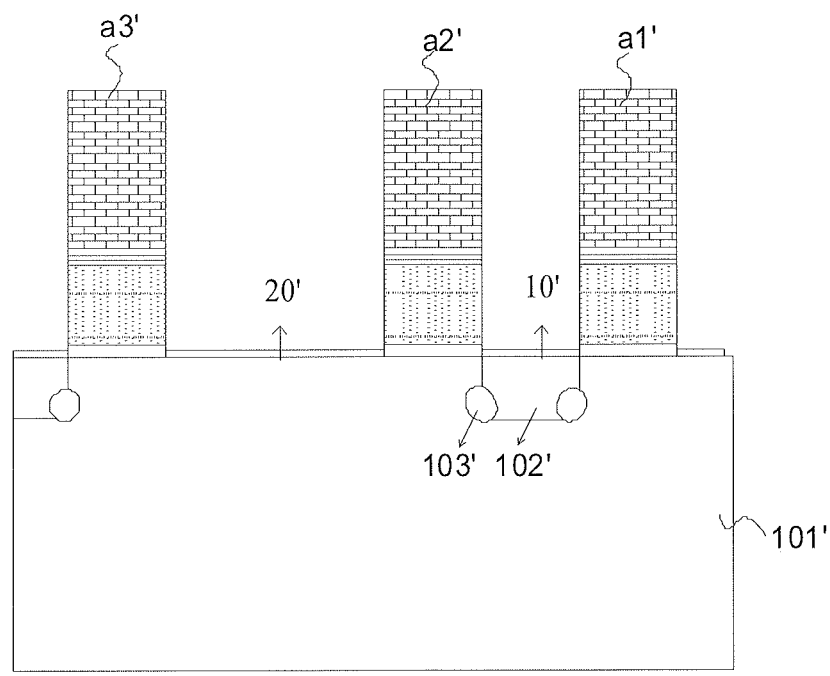
FIG. 2A is a cross-sectional view illustrating a structure after the formation of the source-substrate junction in a self-aligned source region, as known in the prior art.
Figure 2B:
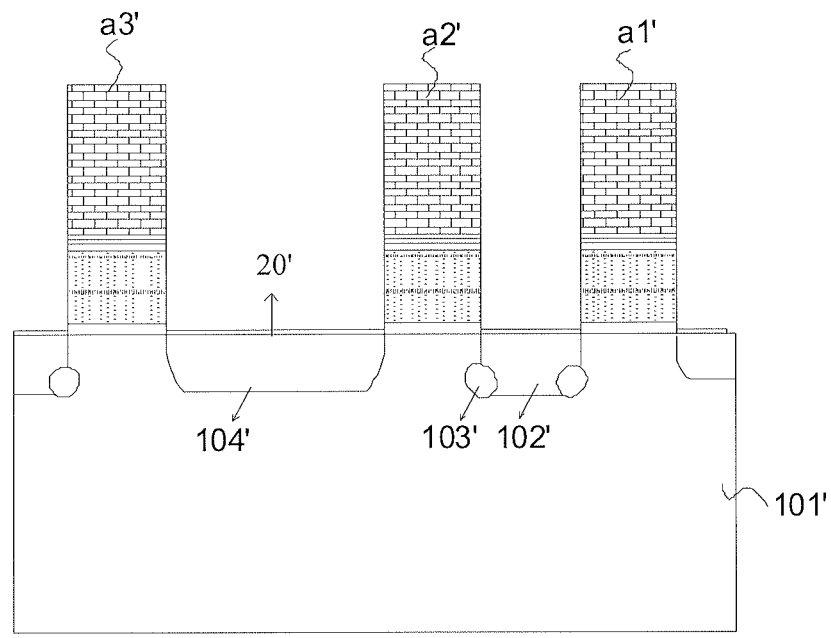
FIG. 2B is a cross-sectional view illustrating a structure after the formation of a lightly doped drain region of FIG. 2A, as known in the prior art.
Figure 2C:
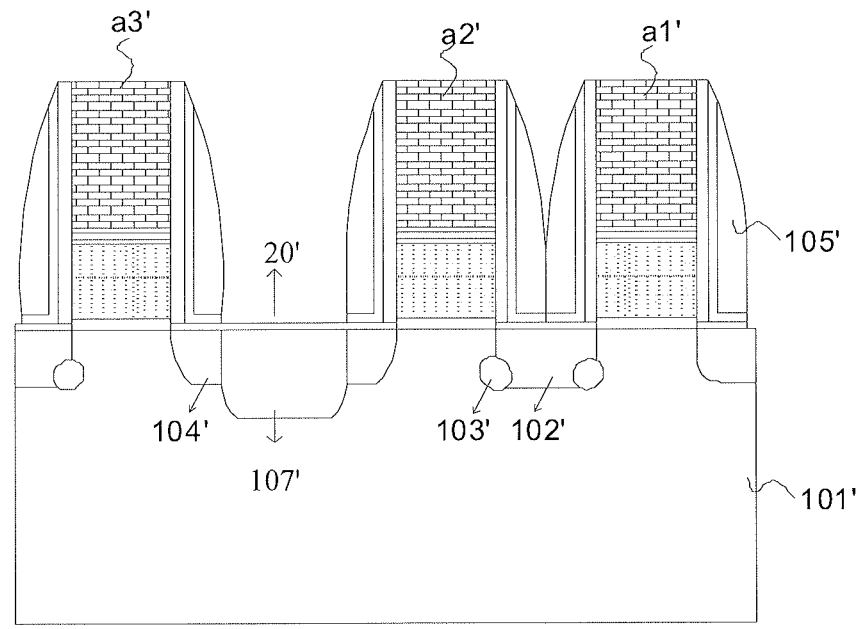
FIG. 2C is a cross-sectional view illustrating a structure after the formation of spacers and a heavily doped drain region, as known in the prior art.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The present invention will now be described more fully herein after with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

As described in the background section, disturbance to the drain region of an existing source-drain structure manufactured by conventional manufacturing methods. Embodiments of the present invention provide a novel source-drain structure and method for manufacturing the same that can solve the problems of drain and read disturbance.

Figure 3:
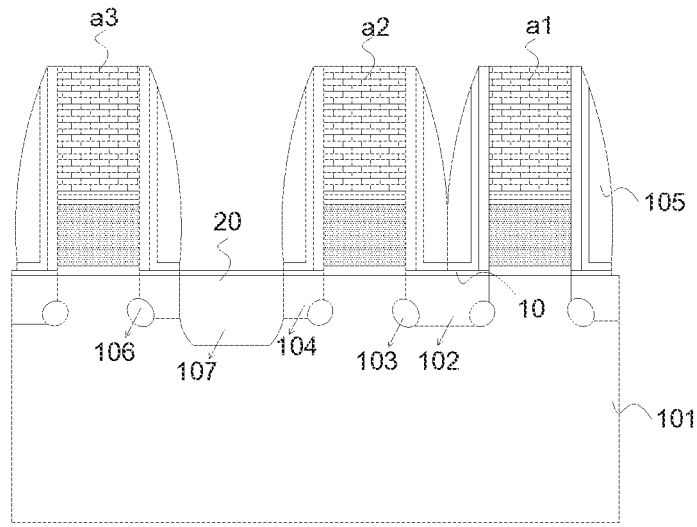
FIG. 3 is a cross-sectional view illustrating a source-drain structure according to an embodiment of the present invention.

FIG. 3 is a cross-sectional view illustrating a source-drain structure according to an embodiment of the present invention. The source-drain structure includes a substrate 101, a source region 10 and a drain region 20 in the substrate 101. Drain region 20 includes a lightly doped drain region 104, a heavily doped drain region 107, and a drain-substrate junction 106. Drain-substrate junction 106 is disposed in the vicinity to (close proximity to) the side portion and the bottom portion of lightly-doped drain region 104, the impurity ions in drain-substrate junction 106 and the impurity ions in lightly doped drain region 104 are opposite-conductivity type ions. A lightly-doped region is referred to as having an impurity concentration of about 3E17 $cm^{-3}$ to 1E19 $cm^{-3}$. A heavily-doped region is referred to as having an impurity concentration of about 5E19 $cm^{-3}$ to 1E21 $cm^{-3}$.

Drain-substrate junction 106 is formed on the basis of lightly-doped drain region 104 of the source-drain structure. Since the impurity ions in drain-substrate junction 106 and the impurity ions in lightly doped drain region 104 are opposite-conductivity type ions, it is possible to complement the steep side of lightly-doped drain region 104 to smooth out (flatten) the steep side of lightly-doped drain region 104, and drain-substrate junction 106 is formed at the junction of the side portion and bottom portion of lightly-doped drain region 104, thus, the steep side of lightly-doped drain region 104 in close proximity to substrate 101 is not affected, so that the source-drain structure of the present invention can reduce the maximum electric field to a minimum value, reduce the ion flow close to the channel, thereby effectively reducing interband tunneling hot-electron excitation effect. Because reducing the maximum electric field of drain-substrate junction 106 of the source-drain structure and reducing the generation of hot carriers are the key approaches for suppressing drain disturbance, the drain disturb of the source-drain structure is effectively reduced.

In order to further reduce the drain disturb, the edge curvature of drain-substrate junction 106 is smaller than the edge curvature of lightly-doped drain region 104, in accordance with the present invention. This not only can smooth out (flatten) the steep side of lightly-doped drain region 104, but also can ensure a more gentle edge of drain-substrate junction 106, further reducing the maximum electric field of drain-substrate junction 106.

The present invention not only improves the drain disturb, but also ensures that the programming speed, the concentration of impurity ions in drain-substrate junction 106 is less than the concentration of impurity ions in heavily doped drain region 107.

In a preferred embodiment, source region 10 includes a source-substrate junction 103 disposed in the junction of the side portion and bottom portion of source region 10 and substrate 101. The drain disturb affecting the source can be suppressed through source-substrate junction 103.

The impurity ions in the source-substrate junction 103 and the impurity ions in the source region 10 are opposite-conductivity type ions, in accordance with the present invention. In a preferred embodiment, the impurity ions concentration of the source-substrate junction 103 is less than the impurity ions concentration of the source region 10, and utilizing the source-substrate junction 103 to take on a portion of the voltage, to enable the flash memory device having such the source-drain structure to operate at higher operating voltage, thus, avoiding the problems of drain disturb suppression and programming speed reduction.

In a preferred embodiment of the present invention, the source-drain structure further includes multiple gate electrodes and sidewalls, the gate electrodes are disposed on the substrate 101 in a region between the source region 10 and drain region 20; sidewalls 105 are disposed on opposite surfaces of the gate electrodes and extending along the gate electrodes to the edge of the heavily doped drain region 107.

The source-drain structure of the present invention can be applied to conventional flash memory devices. In a preferred embodiment, the channel of the source-drain structure is an n-type channel, the impurity ions of the drain-substrate junction 106 are p-type ions. For example, the impurity ions of the source region 10 and drain region 20 are n-type ions such as phosphorus, and the impurity ions of the drain-substrate junction 106 are p-type ions such as boron.

Figure 4:
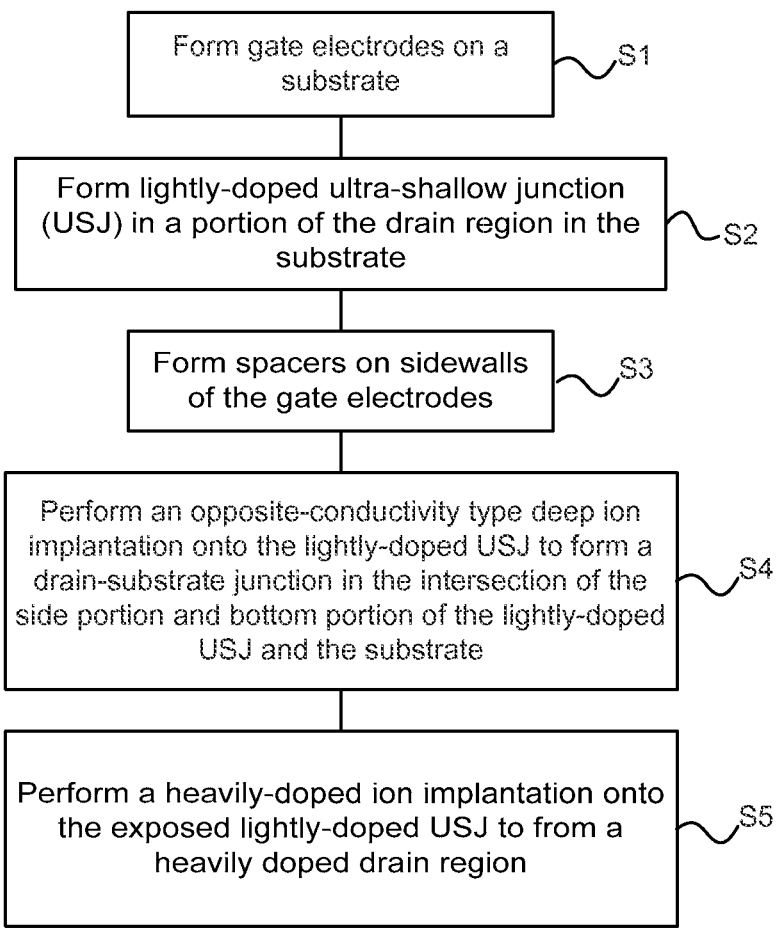
FIG. 4 is a flow chart diagram of a method of manufacturing a source-drain structure according to an embodiment of the present invention.

Embodiments of the present invention provide a method for manufacturing a source-drain structure. FIG. 4 is a flow chart diagram illustrating a method for manufacturing a source-drain structure according to an embodiment of the present invention. The method may include: forming gate electrodes on a substrate 101 (block S1); forming a lightly doped ultra-shallow junction (USJ) 104 in a portion of the drain region 20 in the substrate (block S2);

forming spacers 105 on sidewalls of the gate electrodes (block S3); performing an opposite-conductivity type ion implantation into the lightly doped junction 104 to form a drain-substrate junction 106 in proximity to a junction of the side portion and bottom portion of the lightly doped junction 104; the implanted ions in drain-substrate junction 106 and the implanted ions in lightly doped junction 104 are opposite-conductivity type ions (block S4); and performing a heavily ion implantation onto the exposed lightly doped ultra-shallow junction 104 to form a heavily doped drain region 107 (block S5).

According to the method of the present invention, a drain-substrate junction 106 is formed by performing an opposite-conductivity type ion implantation onto the lightly-doped ultra-shallow junction 104. Because the impurity ions of drain-substrate junction 106 and the impurity ions of the lightly-doped ultra-shallow junction 104 are opposite-conductivity type ions, it is possible to reduce the steep surface structure of the lightly-doped ultra-shallow junction 104 to smooth out the steep surface; and the drain-substrate junction 106 is formed at the junction of the side portion and bottom portion of the lightly-doped ultra-shallow junction 104. Thus, the steep surface of the lightly-doped ultra-shallow junction 104 in the vicinity of (proximity) the substrate 101 is not affected, so that the source-drain structure of the present invention can reduce the maximum electric field of the drain-substrate 106 to a minimum, thereby reducing the ion flow in the proximity of the channel, and effectively reducing interband tunneling hot electron excitation effect. Since reducing the maximum electric field in the drain-substrate junction 106 of the source-drain structure and reducing the hot electron generation are key factors to suppress the drain disturbance, the drain disturbance of the source-drain structure of the present invention is significantly improved. The manufacturing method of the present invention will not affect existing manufacturing processes of the source-drain structure and can be widely used in many applications or devices.

The method of manufacturing a source-drain structure will be described in detail with reference to FIG. 4 and FIGS. 5 through 11. Of course, these exemplary embodiments may be implemented in a variety of forms, and should not be construed as limited to the embodiments set forth herein. It is to be understood that the embodiments are provided for a thorough and complete description of the disclosure. Those of skill in the art will recognize that various modifications and alternatives are possible without departing from the spirit of the invention.

Figure 5:
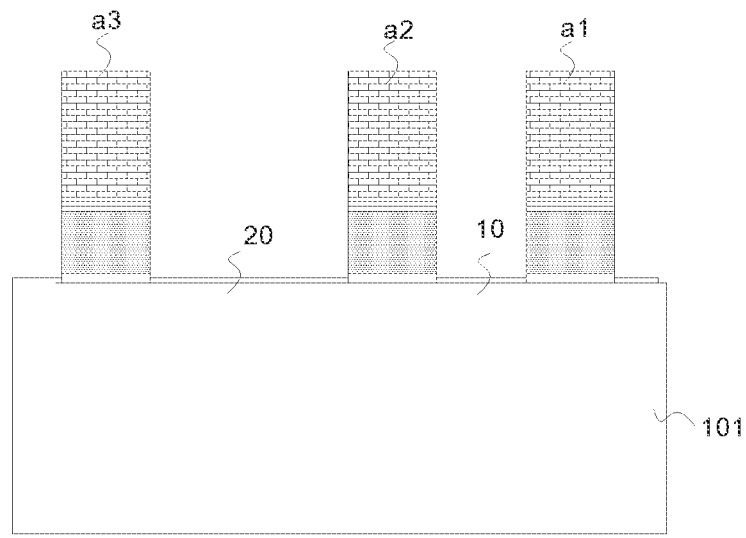
FIGS. 5 through 11 are cross-sectional views of intermediate structures of a manufacturing method FIG. 4.

The method according to the present invention may include providing a substrate 101 and forming gate electrodes on substrate 101 (block S1 in FIG. 4). Referring to FIG. 5, a first gate electrode a1, a second gate electrode a2, and a third gate electrode a3 are formed on substrate 101. A source region 10 is formed in a portion of substrate 101 disposed between first and second gate electrodes a1 and a2. A drain region 20 is formed in a portion of substrate 101 disposed between second and third gate electrodes a2 and a3. Substrate 101 may comprise one of silicon, gallium arsenide (GaAs), insulator, silicon-on-insulator (SOI), stacked SiGe on insulator (S-SiGeOI), SiGeOI, GeOI, and the like. Doped regions (not shown) may be formed in substrate 101, such as an n-type well region and a p-type well region. In addition, substrate 101 may also include an insulation structure, such as shallow trench isolation (STI), the insulation structure may be formed of silicon oxide, silicon nitride, silicon oxynitride, fluorine-doped glass and/ or other conventional low dielectric constant materials. First, second, and third gate electrodes a1, a2, and a3 can be formed using conventional process techniques. For example, the gate electrodes can be p-type metal gates, n-type gates, or other common gates, as known in the art. In addition, other commonly-known elements (not shown) may also be formed in or on substrate 101, such as shallow-doped region, p-type silicon germanium transistor, silicide, contact hole etch stop layer (CESL) that can be formed using conventional CMOS processes.

It is understood that the number of gate electrodes can be any integer number. In the example shown, three gate electrodes are used, but it is understood that the number is arbitrary chosen for describing the example embodiment and should not be limiting.

Figure 6:
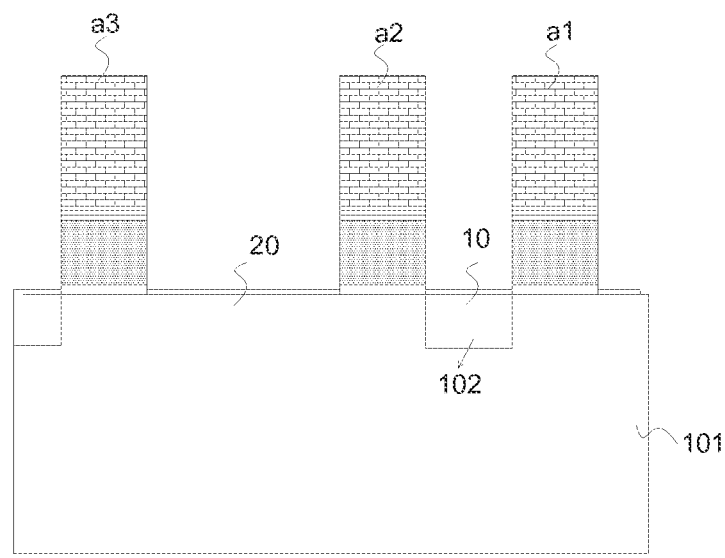

In a preferred embodiment, after formation of the gate electrodes, the source region 10 can be formed. For example, a self-aligned source ion implantation is performed into the source region 10, which is located in a portion of the substrate 101 between first gate electrode a1 and second electrode a2 to form a self-aligned source region 102, as shown in FIG. 6. Prior to performing the self-aligned ion implementation, a photoresist layer is formed on the drain region 20 to protect the portion of substrate 101 below, the self-aligned ion implantation is then performed into the portion of the substrate in the source region 10. The side surface of the thus formed self-aligned source region 102 has a steeper surface with respect to the surface of the substrate 101. The implanted ions into the self-aligned source region can be n-type ions, such as phosphorous ions, arsenic ions. According to conventional implantation processes of the prior art, the concentration of the n-type ions in the self-aligned source region 102 is higher than the concentration of the n-type ions in the heavily doped region 107 of the drain region 20.

Figure 7:
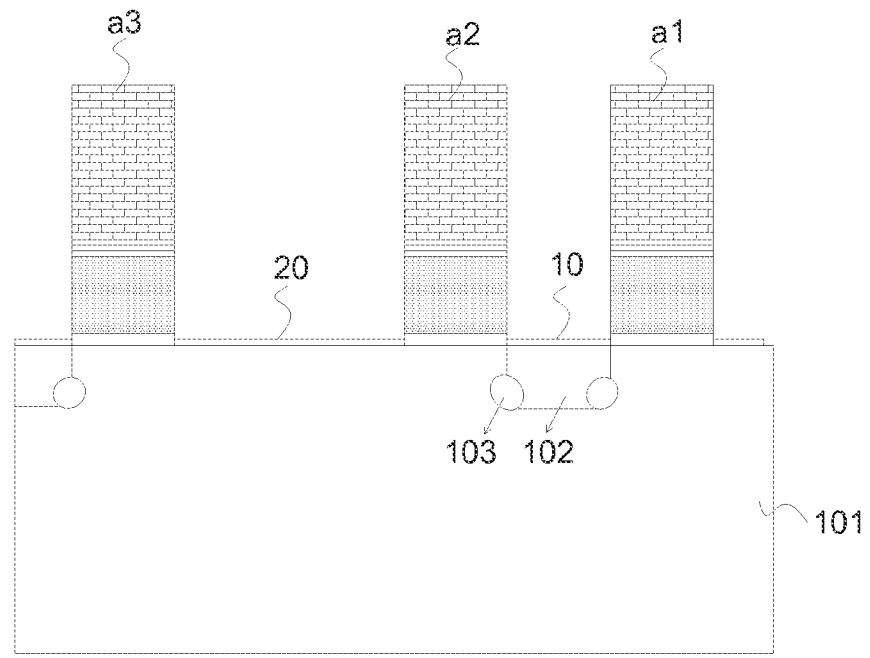

Thereafter, an opposite-conductivity type ion implantation is performed onto the self-aligned source region 102 to form a source-substrate junction 103 in the junction of the side portion and the bottom portion of the self-aligned source region 102, as shown in FIG. 7.

The impurity ions in the source-substrate 103 and the impurity ions in the self-aligned source region 102 are opposite-conductivity type ions, so that it is possible to smooth out (flatten) the steepness of the steep surface of the self-aligned source region 10 to reduce the drain disturb. As would be appreciated by those of skill in the art, the edge curvature of the source-substrate junction 103 can be made smaller than the edge curvature of the self-aligned source region 102 by controlling the implantation angle and implantation energy of opposite-conductivity type ions implantation to further reduce the drain disturb. For example, the implantation angle of the ion beam in relation to the surface of the substrate 101 is about 45 degrees to 80 degrees, the implantation energy is greater than the implantation energy of the self-aligned source region. The implantation dose can also be controlled so that the concentration of impurity ions in source-substrate 103 is smaller than the concentration of impurity ions in the self-aligned source region 102, so that the source-substrate junction 103 can withstand higher operating voltages and avoid the problems of reduced programming speed caused by the drain disturb.

Figure 8:
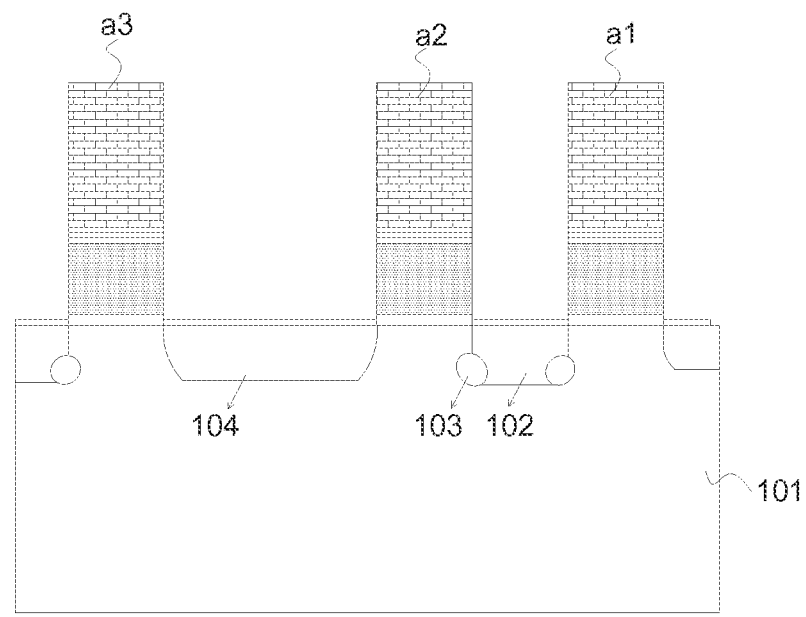

After the formation of the gate electrodes or the source region 10, the method further includes forming a lightly-doped ultra-shallow junction 104 in a portion of the substrate 101 between second and third gate electrodes a2 and a3, as shown in FIG. 8 and block S2 in FIG. 4. The lightly-doped USJ 104 may be formed using any conventional lightly doped drain (LDD) implantation processes.

The lightly-doped USJ 104 serves to reduce the channel leakage current to improve the hot-electron effect of the structure.

The types of the implanted impurity ions can be chosen according to applications. For example, phosphorous ions may be chosen for an n-type channel, the energy of the ion implantation may be in the range between 30 and 50 keV, e.g., 40 keV; the implantation dose in the range between $7E12\ cm^{-2}$ and $1.2E13\ cm^{-2}$, e.g., $9E12\ cm^{-2}$, $1.1E13\ cm^{-2}$. Arsenic ions may be chosen for a p-type channel, the energy of the ion implantation may be in the range between 20 and 70 keV, e.g., 30 keV, 40 keV, or 60 keV; the implantation dose in the range between $4E12\ cm^{-2}$ and $9E12\ cm^{-2}$, e.g., $5E12\ cm^{-2}$, $7E13\ cm^{-2}$.

Figure 9:
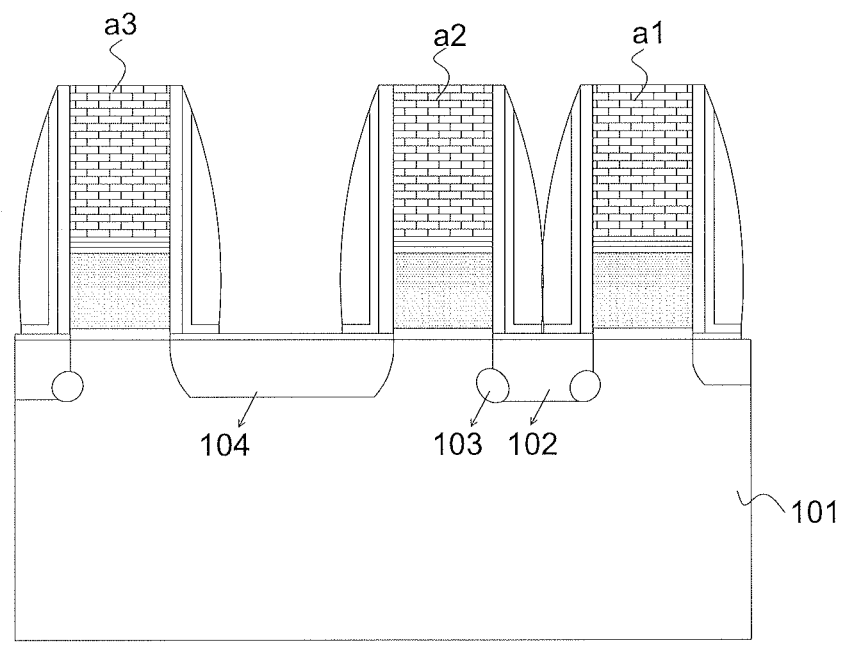

After the formation of the lightly doped USJ 104, the method further includes forming spacers 105 on opposite sidewalls of the gate electrodes, as shown in FIG. 9 and block S3 in FIG. 4. The side walls 105 can be formed using conventional processes, as known in the art. Spacers 105 may comprise an oxide layer, a nitride layer. Preferably, the spacers disposed on the source region 10 between the first and second gate electrodes are in physical contact with each other. This can be achieved by controlling the thickness of the spacers 105. After the spacers adjacent to each other over the source region 10 are in contact with each other, they form a protection layer for the source region 10 for the subsequent formation of the drain region 20 to prevent ions from entering the source region 10 so that the source region 10 and the drain region 20 can be independently formed.

Figure 10:
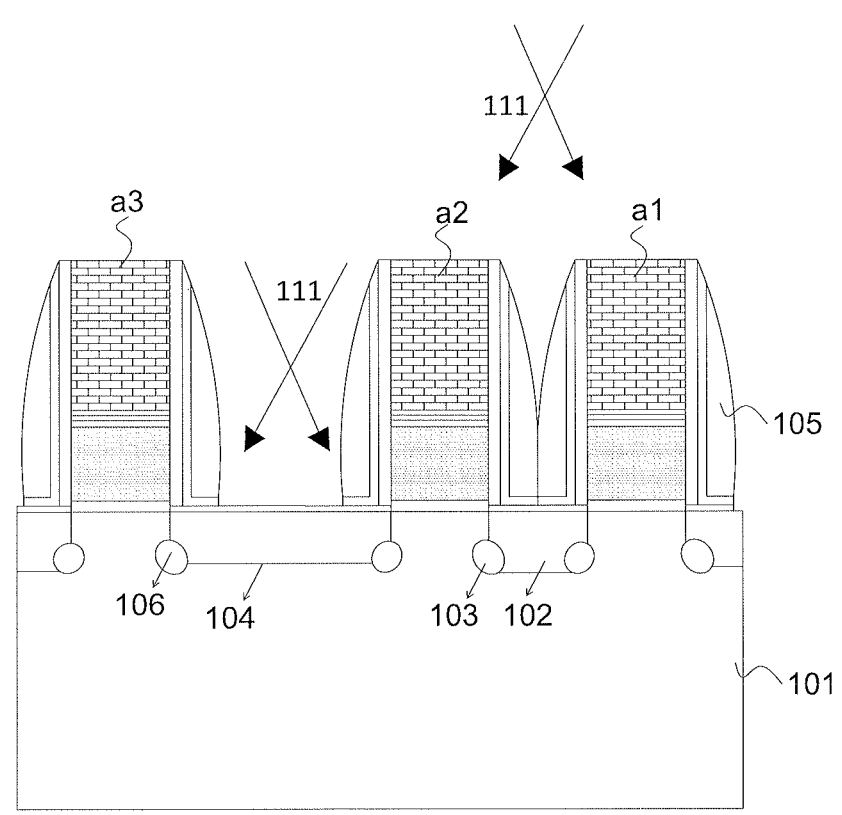

After the formation of the spacers 105, the method further includes performing an opposite-conductivity type deep ion implantation 111 into the lightly-doped USJ 104 to form a drain-substrate junction 106 in the junction of the side portion and bottom portion of the lightly-doped USJ 104, as shown in FIG. 10 and block S4 in FIG. 4. The ions for the deep ion implantation and the impurity ions in the lightly-doped USJ 104 are opposite-conductivity type ions. The opposite-conductivity type deep ion implantation 111 can be any conventional ion implantation processes. Preferably, the implantation angle of the ion beam with respect to the surface of the substrate 101 can be in the range between 45 degrees and 85 degrees, the implantation energy is in the range between 10 keV and 50 keV. By controlling the implantation energy and implantation angle, the drain-substrate junction 106 is formed at the junction of the side surface and bottom surface of the lightly-doped junction 104 and the substrate 101, and the edge curvature of the drain-substrate junction 106 at the lightly-doped USJ 104 is less than the edge curvature of the lightly-doped USJ 104.

When the spacers 105 corresponding to the source region 10 are in physical contact with each other, the in-contact spacers can be used as a mask for the opposite-conductivity type deep ion implantation. When the spacers 105 corresponding to the source region 10 are not in physical contact with each other, a photoresist layer may be first formed to mask portions of the substrates to protect them from being affected by the anti-type ion implantation. In a preferred embodiment, the spacers 105 corresponding to the source region 10 are formed to be in physical contact with each other.

The anti-type deep ion implantation can be performed in different steps. Firstly, a first anti-type deep ion implantation is performed at a region in close proximity to the lightly-doped USJ 104, a second anti-type deep ion implantation is then performed into a portion of the lightly-doped USJ 104 adjacent to the gate electrodes. For example, a first anti-type deep ion implantation is performed at the lightly-doped USJ 104 in close proximity to the second gate electrode. Thereafter, a second anti-type deep ion implantation is performed at the lightly-doped USJ 104 in close proximity to the third gate electrode. The implantation angle, dose, and energy of the first and second anti-type deep ion implantations can be controlled to be at the same level.

Figure 11:
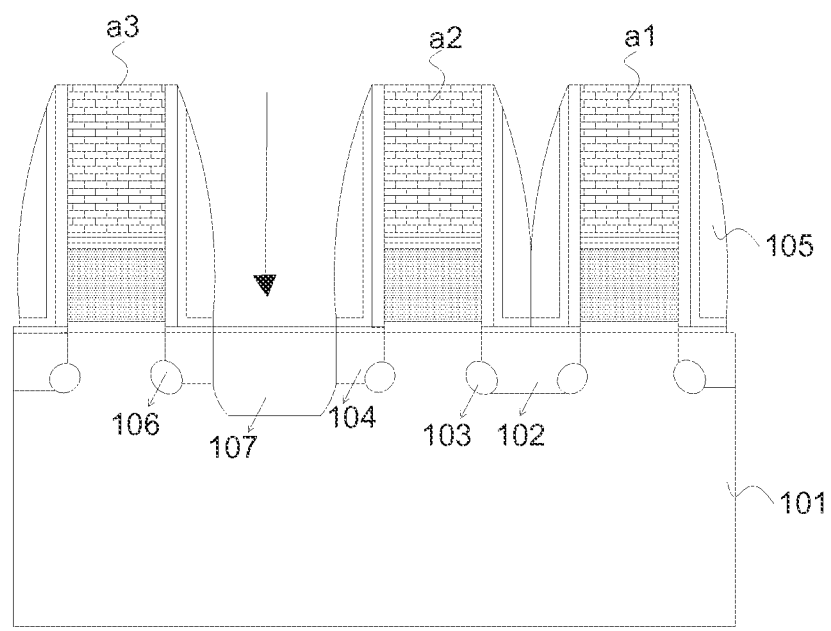

After forming the drain-substrate junction 106, the method further includes performing a heavily-doped ion implantation 112 in the exposed portion of the lightly-doped USJ 104 to form a heavily-doped region 107, as shown in FIG. 11 and block S5 in FIG. 4. The heavily-doped ion implantation can be performed using a medium energy implantation of the conventional art, so that the implantation depth is deeper than the depth of the lightly-doped USJ 104, and the implantation dose is higher than the dose of the lightly-doped USJ 104.

Referring to FIG. 11, the width of the heavily-doped drain region 107 is smaller than the width of the lightly-doped USJ 104 (not drawn to scale), this is due to the spacers disposed on sidewalls of the second and third gate electrodes that are facing each other, these spacers form a shield at the sidewalls of the gate electrodes adjacent to the channel, thus, reducing the width of the heavily-doped drain region 107 with respect to the width of the lightly-doped USJ 104.

Moreover, the opposite-conductivity type deep ion implantation in block S4 has a dose smaller than the dose of the heavily-doped ion implantation of block S5, thus, the impurity ion concentration in the drain-substrate 106 is lower than the impurity ion concentration in the heavily-doped drain region 107. In an embodiment, the dose of the heavily-doped ion implantation in block S5 is in the range between $2E11\ cm^{-2}$ and $2E13\ cm^{-2}$. The specific ion dose and the concentration of impurity ions can be selected according to design requirements.

It can be seen from the above-described embodiments that the present invention provides a number advantages and benefits:

(1) In the drain-substrate junction of the source-drain structure, as the impurity ions in the drain-substrate junction and the impurity ions in the lightly-doped USJ 104 are opposite-conductivity type ions, it is possible to alleviate the steep surface of the lightly-doped ultra-shallow junction structure to smooth out the steep surface. The drain-substrate junction is formed at the junction of the side portion and the bottom portion of the lightly-doped junction, therefore, the deep side surface of the lightly-doped USJ in close proximity to the surface of the substrate is not affect, so that the source-drain structure of the present invention may reduce the maximum electric field to a minimum value and reduce the ion flow in the vicinity (proximity) to the channel. Thus, the inter-band tunneling hot electron excitation effect is effectively reduced. Because reducing the maximum electric field and the generation of hot carriers of the source-drain structure are the key factors for suppressing the drain disturb, the drain disturb problems are effectively reduced.

(2) The manufacturing method of the present invention does not affect existing process techniques so that the method can be widely used.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method of manufacturing a source-drain structure, the method comprising:
　forming a plurality of gate electrodes on a substrate;
　forming a drain region and a source region;
　forming a lightly-doped ultra-shallow junction comprising a plurality of one-conductivity type impurity ions in the drain region;
　forming spacers on opposite sides of the gate electrodes;
　performing a first opposite-conductivity type deep ion implantation comprising a plurality of impurity ions onto the lightly-doped ultra-shallow junction to form a drain-substrate junction in the vicinity of a junction between a side portion and a bottom portion of the lightly-doped ultra-shallow junction and the substrate, the drain-substrate junction comprising the plurality of impurity ions opposite the plurality of one-conductivity type impurity ions of the lightly-doped ultra-shallow junction; and
　performing a heavily-doped ion implantation onto the lightly-doped ultra-shallow junction to form a heavily-doped drain region.

2. The method of claim 1, wherein spacers on adjacent gate electrodes in a source region disposed between the adjacent gate electrodes are in contact with each other.

3. The method of claim 1, wherein the first opposite-conductivity type deep ion implantation is performed at an angle of an ion beam in relation to a surface of the substrate in a range between 45 degrees and 85 degrees, an energy in a range between 10 keV and 50 keV.

4. The method of claim 1, wherein the first opposite-conductivity type deep ion implantation is performed with a dose smaller than a dose of the heavily-doped ion implantation.

5. The method of claim 4, wherein the dose of the heavily-doped ion implantation is in a range between $2E11$ $cm^{-2}$ and $2E13$ $cm^{-2}$.

6. The method of claim 1, further comprising, prior to forming the lightly-doped ultra-shallow junction in the drain region:
　performing a self-aligned ion implantation comprising a plurality of first-conductivity type ions onto a portion of the substrate to form a self-aligned source region;
　performing a second deep opposite-conductivity type ion implantation comprising a plurality of second ions opposite the plurality of first-conductivity type ions onto the formed self-aligned source region to form a source-substrate junction in the vicinity of a junction between a side portion and bottom portion of the self-aligned source region and the substrate.

7. The method of claim 6, wherein performing the second deep opposite-conductivity type ion implantation comprises using an implantation angle between 45 degrees and 80 degrees in relation to a surface of the substrate, and an energy greater than an energy of the self-aligned ion implantation.

8. The method of claim 1, wherein the heavily-doped drain region divides the lightly-doped ultra-shallow junction into a first junction region and a second junction region, and the heavily-doped drain region has a width smaller than a width of the first junction region or a width of the second junction region.

9. The method of claim 1, wherein the drain-substrate junction comprises an edge curvature smaller than an edge curvature of the lightly-doped ultra-shallow junction.

\* \* \* \* \*